United States Patent
Oshima et al.

(10) Patent No.: US 10,962,882 B2
(45) Date of Patent: *Mar. 30, 2021

(54) CIRCUIT PATTERN FORMING SHEET, CIRCUIT PATTERN MANUFACTURING APPARATUS, CIRCUIT PATTERN MANUFACTURING METHOD, AND CIRCUIT PATTERN MANUFACTURING PROGRAM

(71) Applicant: KANTATSU CO., LTD., Yaita (JP)

(72) Inventors: Eiji Oshima, Tochigi (JP); Tomio Kusakabe, Chiba (JP)

(73) Assignee: KANTATSU CO., LTD., Tochigi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/569,070

(22) PCT Filed: Jun. 1, 2016

(86) PCT No.: PCT/JP2016/066225
§ 371 (c)(1),
(2) Date: Oct. 24, 2017

(87) PCT Pub. No.: WO2016/199641
PCT Pub. Date: Dec. 15, 2016

(65) Prior Publication Data
US 2018/0139849 A1    May 17, 2018

(30) Foreign Application Priority Data

Jun. 9, 2015    (JP) .............................. JP2015-116660

(51) Int. Cl.
*G03F 7/20* (2006.01)
*H05K 3/02* (2006.01)

(52) U.S. Cl.
CPC .......... *G03F 7/2051* (2013.01); *G03F 7/2045* (2013.01); *H05K 3/02* (2013.01);
(Continued)

(58) Field of Classification Search
CPC .............. H05K 3/027; H05K 2203/107; G03F 7/2045; G03F 7/70283; G03F 7/70291;
(Continued)

(56) References Cited

U.S. PATENT DOCUMENTS

| 3,891,441 A | 6/1975 | Tsuji et al. |
| 4,304,839 A | 12/1981 | Cohen et al. |

(Continued)

FOREIGN PATENT DOCUMENTS

| CN | 103261302 A | 8/2013 |
| CN | 107660033 A | 2/2018 |

(Continued)

OTHER PUBLICATIONS

International Search Report for PCT/JP2016/066225, dated Aug. 16, 2016.
(Continued)

*Primary Examiner* — Christina A Riddle
(74) *Attorney, Agent, or Firm* — Hamre, Schumann, Mueller & Larson, P.C.

(57) ABSTRACT

A circuit pattern is quickly created or changed by exposing the circuit pattern on a board without using a photo mask on which the circuit pattern is formed. There is provided a circuit pattern manufacturing apparatus including a forming unit that forms a circuit pattern by irradiating, with a light beam, a circuit pattern forming sheet including an insulating sheet base material layer and a mixture layer made of a mixture containing a conductive material and a photo-curing resin. The forming unit includes, as an optical engine, a
(Continued)

housing, a laser diode, a prism mirror, an inclined mirror, a bottom mirror, and a driving mirror.

11 Claims, 16 Drawing Sheets

(52) U.S. Cl.
CPC ..... H05K 3/027 (2013.01); *H05K 2203/0514* (2013.01); *H05K 2203/107* (2013.01)

(58) Field of Classification Search
CPC ............ G03F 7/70375; G03F 7/70383; G03F 7/70391; G03F 7/704; G03F 7/7005; G03F 7/7015; G03F 7/702; G03F 7/70233; G03F 7/70316; G02B 26/06; G03B 27/54
USPC ........... 355/27, 53, 55, 67–71, 77, 133, 400; 430/9, 14, 16, 20, 199, 252, 311, 495.1, 430/524, 564, 627, 46.1, 46.5, 84; 250/492.1, 492.2, 493.1, 494.1
See application file for complete search history.

(56) References Cited

U.S. PATENT DOCUMENTS

| | | | | |
|---|---|---|---|---|
| 5,679,268 | A * | 10/1997 | Takahashi | H05K 1/0293 216/13 |
| 8,080,350 | B2 * | 12/2011 | Banba | G03F 7/0233 430/14 |
| 2003/0214571 | A1 | 11/2003 | Ishikawa et al. | |
| 2003/0215574 | A1 | 11/2003 | Ishino | |
| 2004/0223129 | A1 * | 11/2004 | Ishikawa | G03B 27/54 355/53 |
| 2005/0037281 | A1 | 2/2005 | Sato et al. | |
| 2005/0253922 | A1 | 11/2005 | Hashiguchi | |
| 2005/0285231 | A1 * | 12/2005 | Arao | H01L 21/6835 257/635 |
| 2006/0215138 | A1 | 9/2006 | Liu | |
| 2006/0269217 | A1 | 11/2006 | Shirota et al. | |
| 2009/0091730 | A1 * | 4/2009 | Tanaka | G03F 7/70116 355/67 |
| 2009/0173723 | A1 * | 7/2009 | Nakagawa | B23K 26/0853 219/121.71 |
| 2009/0286173 | A1 * | 11/2009 | Ushirokawa | B23K 26/032 430/30 |
| 2013/0025921 | A1 * | 1/2013 | Chuang | H05K 3/10 174/259 |
| 2013/0285366 | A1 | 10/2013 | Tailor et al. | |
| 2013/0288002 | A1 | 10/2013 | Hwang et al. | |
| 2013/0292862 | A1 | 11/2013 | Joyce | |
| 2013/0308111 | A1 | 11/2013 | Lee et al. | |
| 2013/0314683 | A1 * | 11/2013 | Watanabe | G02B 26/06 355/71 |
| 2015/0182997 | A1 | 7/2015 | Balantrapu et al. | |
| 2015/0223320 | A1 * | 8/2015 | Gerhau er | H05K 1/0373 361/762 |
| 2017/0232669 | A1 | 8/2017 | Watanabe et al. | |
| 2018/0087897 | A1 | 3/2018 | Oshima et al. | |
| 2018/0088471 | A1 | 3/2018 | Oshima et al. | |
| 2018/0222108 | A1 * | 8/2018 | Oshima | B29C 64/264 |
| 2018/0297274 | A1 | 10/2018 | Oshima et al. | |

FOREIGN PATENT DOCUMENTS

| | | |
|---|---|---|
| JP | 08-230048 A | 9/1996 |
| JP | 2000-238137 A | 9/2000 |
| JP | 2003-039564 A | 2/2003 |
| JP | 2004-022623 A | 1/2004 |
| JP | 2004-128418 A | 4/2004 |
| JP | 2004-281738 A | 10/2004 |
| JP | 2006-319138 A | 11/2006 |
| JP | 2012-014015 A | 1/2012 |
| JP | 2012-119410 A | 6/2012 |
| JP | 2012-194253 A | 10/2012 |
| JP | 2013-67016 A | 4/2013 |
| JP | 2013-075389 A | 4/2013 |
| JP | 2013-235202 A | 11/2013 |
| JP | 2014-192275 A | 10/2014 |
| JP | 2017-203199 A | 11/2017 |

OTHER PUBLICATIONS

International Search Report for PCT/JP2016/065642, dated Jul. 12, 2016.
Office Action issued in Chinese Application No. 201721112419.1, dated Feb. 13, 2018.
Co-pending U.S. Appl. No. 15/569,058, filed Oct. 24, 2017.
Co-pending U.S. Appl. No. 15/873,696, filed Jan. 17, 2018.
Office Action issued in U.S. Appl. No. 15/681,217, dated Apr. 18, 2018.
Office Action issued in Chinese Application No. 201721112370.X, dated Apr. 28, 2018.
Office Action issued in co-pending U.S. Appl. No. 15/681,217, dated Feb. 6, 2019.
Office Action issued in co-pending U.S. Appl. No. 15/681,720, dated Apr. 1, 2019.
Office Action issued in co-pending U.S. Appl. No. 15/569,058, dated Mar. 5, 2019.
Co-pending U.S. Appl. No. 16/375,749, filed Apr. 4, 2019.
Co-pending U.S. Appl. No. 16/386,080, filed Apr. 16, 2019.
Office Action issued in co-pending U.S. Appl. No. 15/681,720, dated Sep. 20, 2018.
Office Action issued in co-pending U.S. Appl. No. 15/681,217, dated Oct. 22, 2018.
Office Action for Japanese Patent Application No. 2015-116660, dated Aug. 21, 2018.
Report of Reconsideration by Examiner Before Appeal, issued in Japanese Patent Application No. 2015-116660, dated Dec. 13, 2018.
Co-pending U.S. Appl. No. 16/146,696, filed Sep. 28, 2018.
Co-pending U.S. Appl. No. 16/146,780, filed Sep. 28, 2018.
Co-pending U.S. Appl. No. 16/146,851, filed Sep. 28, 2018.
Office Action issued in co-pending U.S. Appl. No. 15/569,058, dated Nov. 5, 2018.

* cited by examiner

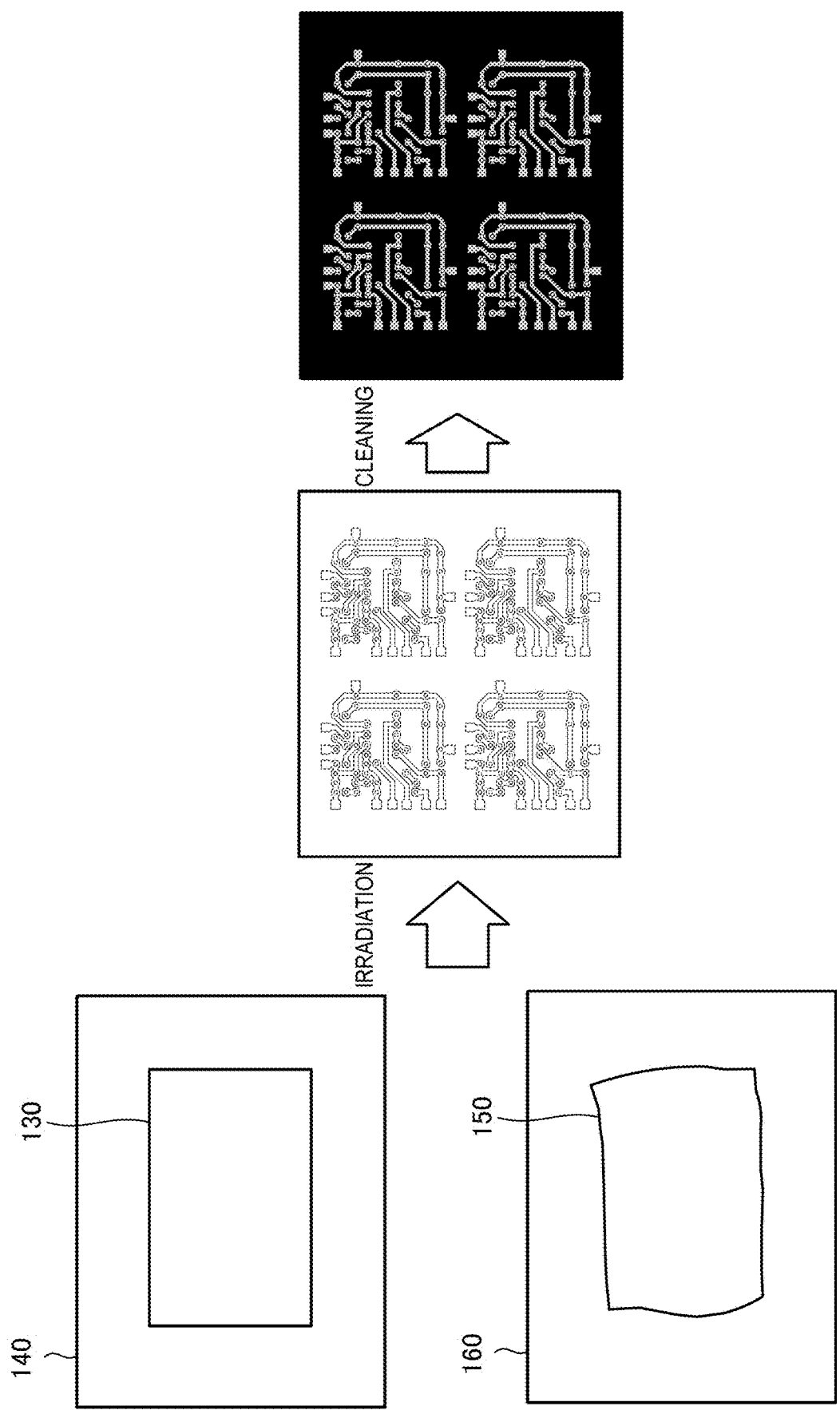

CIRCUIT PATTERN FORMING SHEET, CIRCUIT PATTERN MANUFACTURING APPARATUS, CIRCUIT PATTERN MANUFACTURING METHOD, AND CIRCUIT PATTERN MANUFACTURING PROGRAM

CROSS REFERENCE TO RELATED APPLICATIONS

This application is a U.S. National Stage Application under 35 U.S.C. 071 of International Patent Application No. PCT/JP2016/066225 filed Jun. 1, 2016, which claims benefit of priority to Japanese patent application No. 2015-116660 filed Jun. 9, 2015, the disclosures of all of which are incorporated herein in their entireties.

TECHNICAL FIELD

The present invention relates to a circuit pattern forming sheet, a circuit pattern manufacturing apparatus, a circuit pattern manufacturing method, and a circuit pattern manufacturing program.

BACKGROUND ART

In the above technical field, patent literature 1 discloses a technique of irradiating, with light, a photomask on which a circuit pattern is formed, and exposing the circuit pattern on a board.

CITATION LIST

Patent Literature

Patent literature 1: Japanese Patent Laid-Open No. 2012-194253

SUMMARY OF THE INVENTION

Technical Problem

In the technique described in the above literature, since a circuit pattern is exposed on a board using a photomask on which the circuit pattern is formed, it is impossible to quickly create or change the circuit pattern.

The present invention enables to provide a technique of solving the above-described problem.

Solution to Problem

One aspect of the present invention provides a circuit pattern forming sheet comprising:
an insulating sheet base material layer; and
a mixture layer made of a mixture containing a conductive material and a photo-curing resin.

Another aspect of the present invention provides a circuit pattern manufacturing apparatus comprising:
a forming unit that forms a pattern by irradiating, with a light beam, a board applied with a mixture containing a conductive material and a photo-curing resin.

Still other aspect of the present invention provides a circuit pattern manufacturing method comprising:
forming a pattern by irradiating, with a light beam, a board applied with a mixture containing a conductive material and a photo-curing resin.

Still other aspect of the present invention provides a circuit pattern manufacturing program for causing a computer to execute a method, comprising:
forming a pattern by irradiating, with a light beam, a board applied with a mixture containing a conductive material and a photo-curing resin.

Advantageous Effects of Invention

According to the present invention, since a circuit pattern is exposed on a board without using a photomask on which the circuit pattern is formed, it is possible to quickly create or change the circuit pattern.

BRIEF DESCRIPTION OF DRAWINGS

FIG. 1B is a view showing an outline of a circuit pattern forming process by the circuit pattern manufacturing apparatus according to the first example embodiment of the present invention;

DESCRIPTION OF EXAMPLE EMBODIMENTS

Example embodiments of the present invention will now be described in detail with reference to the drawings. It should be noted that the relative arrangement of the components, the numerical expressions and numerical values set forth in these example embodiments do not limit the scope of the present invention unless it is specifically stated otherwise.

First Example Embodiment

A circuit pattern manufacturing apparatus 100 according to the first example embodiment of the present invention will be described with reference to FIGS. 1A to 6. The circuit pattern manufacturing apparatus 100 is an apparatus that forms a circuit pattern by irradiating a circuit pattern forming sheet with a light beam.

<<Technical Premise>>

The technical premise of this example embodiment will be described first. In general, a circuit pattern is determined by designing a PCB (Printed Circuit Board) using CAD (Computer Aided Design) such as PADS (Personal Automated Design System). After that, the circuit pattern is formed by a subcontracting maker using silk screen printing or a photoresist method. There is an increasing need to examine, using an actual product, whether the design of a circuit pattern is appropriate in addition to confirmation on the screen, such as the monitor, of a personal computer or the like, in these design processes.

In a conventional circuit pattern development method, a circuit pattern printing mask to be used for screen printing or a photoresist method needs to be subcontracted and manufactured. This poses the problem that a long time and a high cost are required to actually complete a prototype. To reduce the time and cost, development of a circuit pattern is often advanced by only confirming, on the monitor of a personal computer or the like, a circuit pattern created by CAD or CAE (Computer Aided Engineering). It is, however, difficult to completely grasp a problem by confirming data of the circuit pattern displayed on the monitor. In many cases, therefore, the problem is noticed only after a prototype is manufactured. To cope with this, a mask needs to be subcontracted to manufacture a prototype, thereby increasing the time and cost to complete the prototype. Furthermore, in a method using a mask, such as screen printing, for example, it is impossible to form a circuit pattern for a housing, its curved portion or corner portion, or the like.

<Technique of Example Embodiment>

Figure 1A:
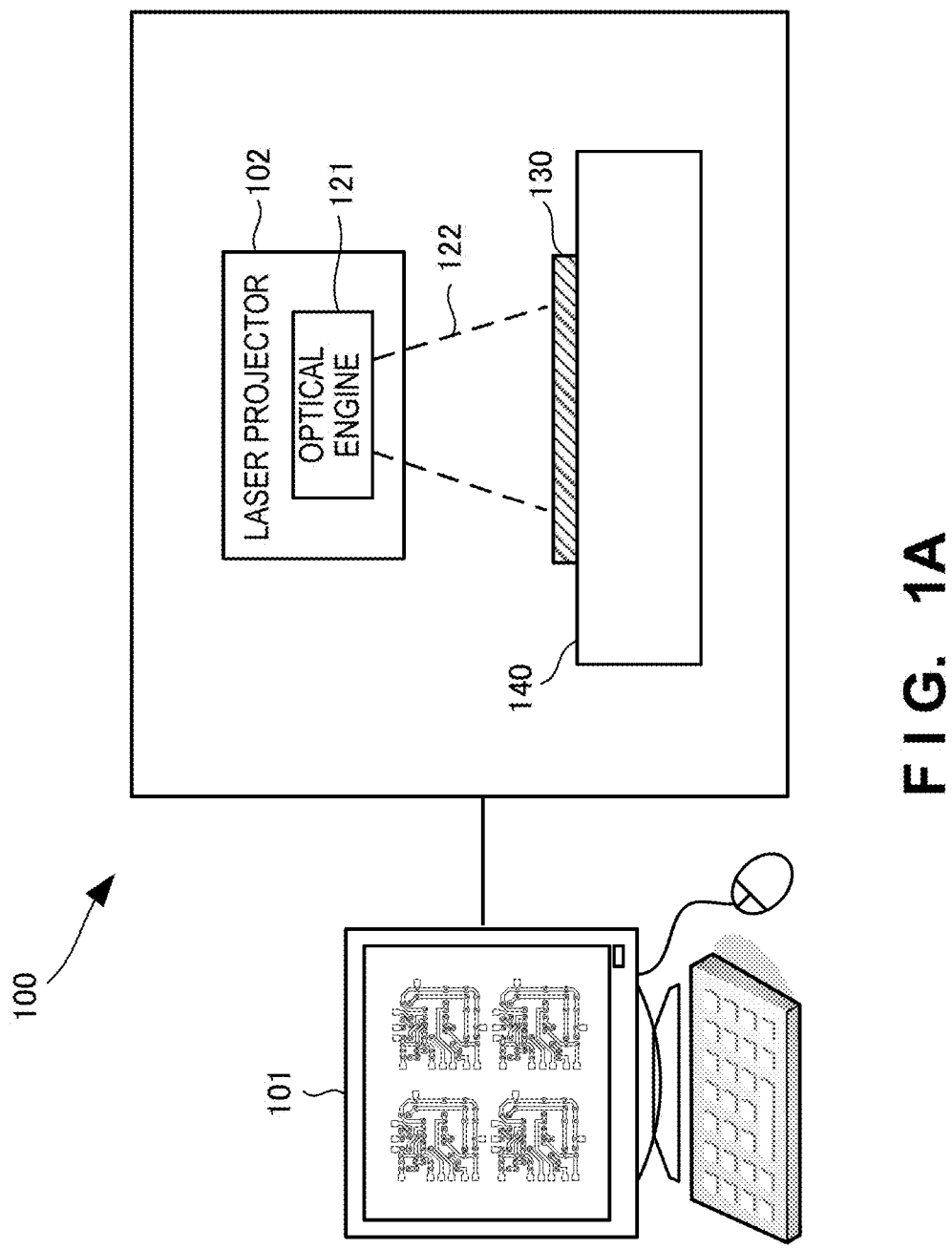
FIG. 1A is a view showing an outline of the arrangement of a circuit pattern manufacturing apparatus according to the first example embodiment of the present invention.

As shown in FIG. 1A, the circuit pattern manufacturing apparatus 100 includes a controller 101 and a laser projector 102. The controller 101 controls the laser projector 102 to form a circuit pattern on a circuit pattern forming sheet 130 placed on a stage 140. That is, the controller 101 forms a circuit pattern on the sheet 130 by performing irradiation with a light beam 122 from an optical engine 121 based on circuit pattern data created by CAD. Note that creation of a circuit pattern is not limited to CAD. For example, an application of a smartphone, CAE, or the like may be used to create a circuit pattern. The controller 101 also controls the overall operation of the circuit pattern manufacturing apparatus 100.

The laser projector 102 includes the optical engine 121. The controller 101 controls the laser projector 102 to irradiate the sheet 130 with the light beam from the optical engine 121.

The sheet 130 is made of a mixture containing a conductive material and a photo-curing resin. When the sheet 130 is irradiated with the light beam, a portion irradiated with the light beam is cured, and then an uncured portion is washed away, thereby forming a circuit pattern. Assume that the sheet 130 is an adhesive sheet. In this case, by only adhering the sheet on which the circuit pattern is formed, it is possible to draw the circuit pattern on not only a flat surface but also a curved surface in any place.

FIG. 1B is a view showing an outline of a circuit pattern forming process by the circuit pattern manufacturing apparatus 100 according to this example embodiment. When the circuit pattern forming sheet 130 placed on the stage 140 is irradiated with the light beam by a scan based on the circuit pattern created by the controller 101, the circuit pattern is drawn on the sheet 130. The irradiation time of the light beam is about 20 min. Then, the circuit pattern drawn on the sheet 130, that is, the portion that has been irradiated with the light beam is cured. After that, the uncured portion is cleaned and washed away. This can manufacture a circuit pattern according to the circuit pattern created by the controller 101. Consequently, for example, it is possible to immediately manufacture a prototype using the circuit pattern designed on CAD, thereby performing evaluation.

The sheet 130 includes at least two layers of an insulating sheet base material layer and a mixture layer. Typically, the mixture layer is stacked on the insulating sheet base material layer. However, the arrangement of the sheet 130 is not limited to this. For example, the sheet 130 may be arranged by alternately stacking insulating sheet base material layers and mixture layers or by sandwiching an insulating sheet base material layer by mixture layers from above and below. The mixture contains, for example, about 83 wt % of silver particles and about 5 to 15 wt % of a photo-curing resin, and the average diameter of the silver particles is about 10 nm. However, the present invention is not limited to this. For example, a rigid base material, a flexible base material, a rigid flexible base material, or the like can be used as the insulating sheet base material. However, the present invention is not limited to them, and any material appropriate as the sheet base material may be used.

Instead of using the sheet 130, a paste-like mixture contacting a conductive material and a photo-curing resin may be thinly applied to a board 160, and a paste 150 may be irradiated with the light beam. In this example embodiment, silver (Ag) is assumed as the conductive material. However, the present invention is not limited to this. In addition to silver, for example, one of gold (Au), copper (Cu), platinum (Pt), lead (Pb), zinc (Zn), tin (Sn), iron (Fe), and aluminum (Al) may be used solely or some of them may be mixed and used. Furthermore, although ultraviolet (UV) is representative of the light beam, the present invention is not limited to this.

<Arrangement of Optical Engine>

Figure 2A:
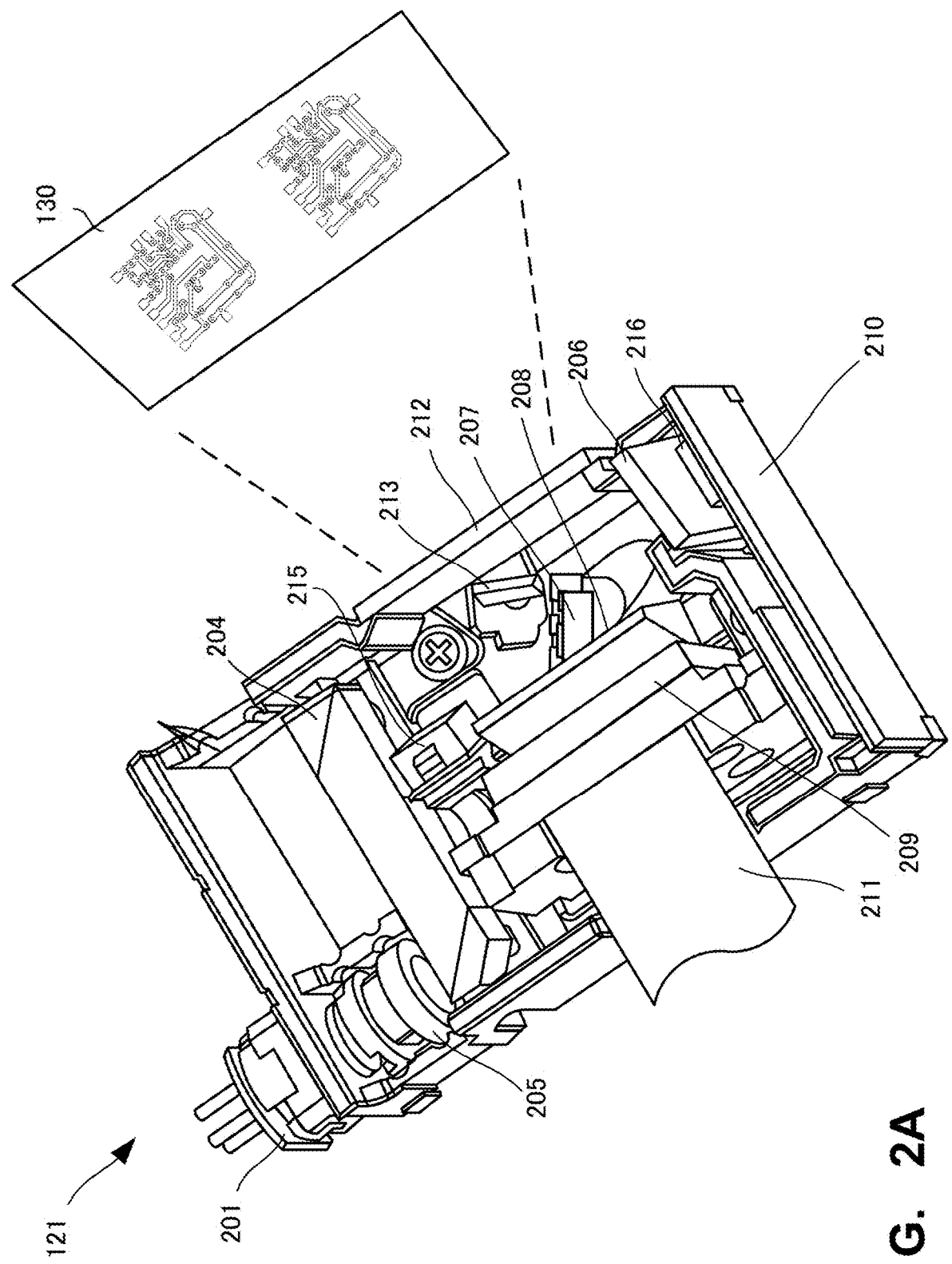
FIG. 2A is a view showing the arrangement of an optical engine included in the circuit pattern manufacturing apparatus according to the first example embodiment of the present invention.
Figure 2B:
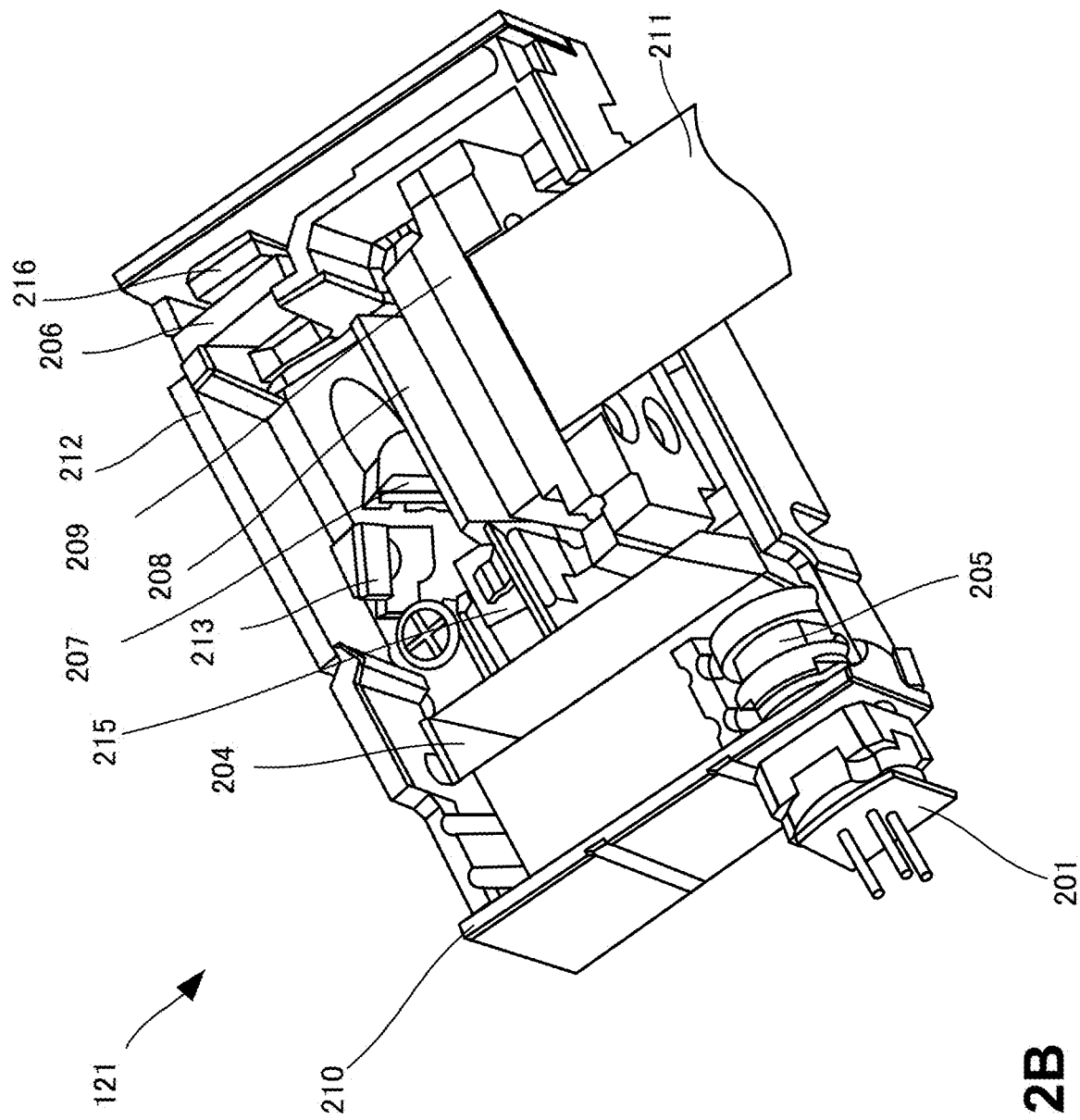
FIG. 2B is a view showing the arrangement of the optical engine included in the circuit pattern manufacturing apparatus according to the first example embodiment of the present invention.
Figure 2C:
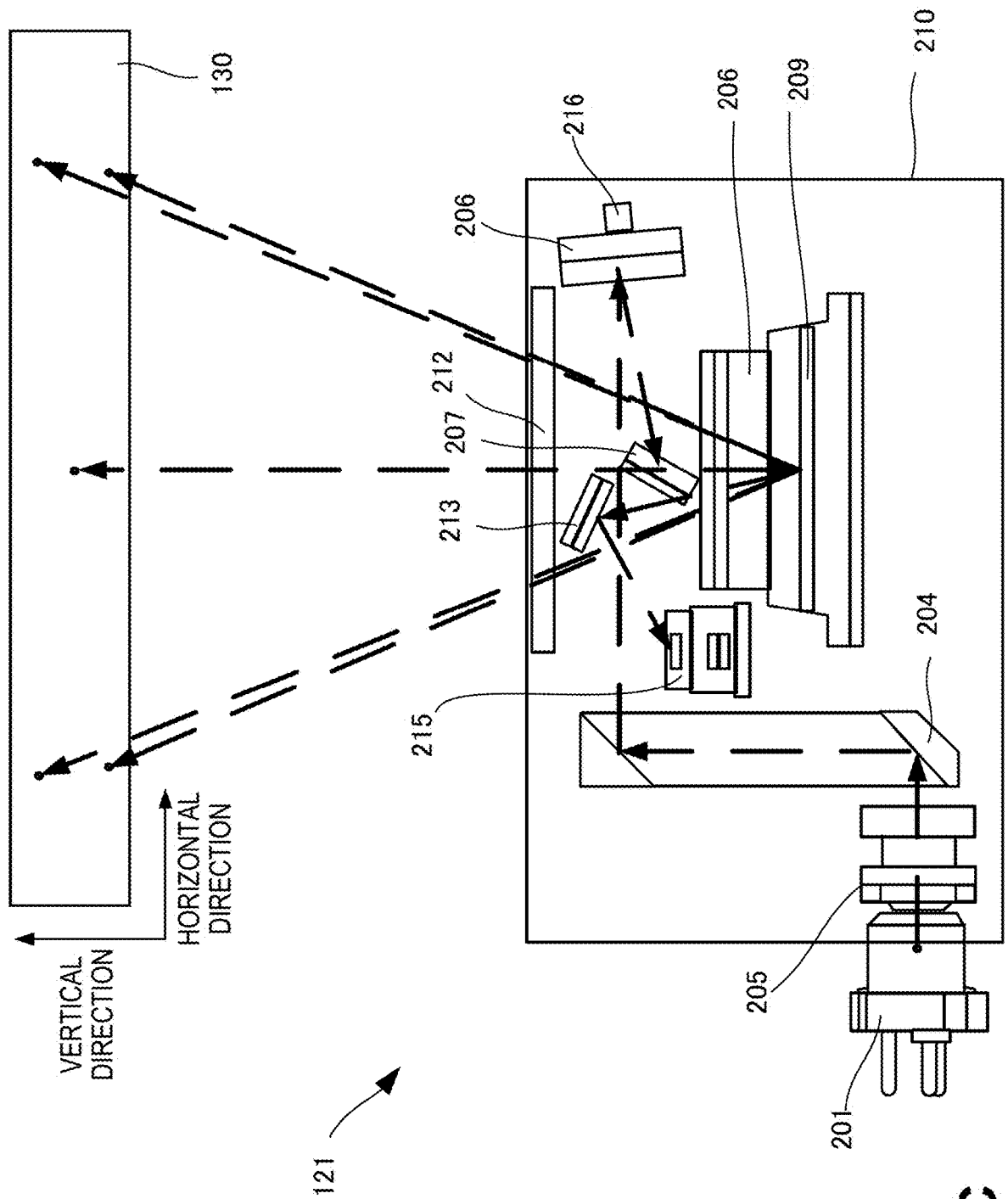
FIG. 2C is a view showing an optical path in the optical engine included in the circuit pattern manufacturing apparatus according to the first example embodiment of the present invention.

The optical engine 121 incorporated in the laser projector 102 will be described with reference to FIGS. 2A to 2C. FIGS. 2A and 2B are perspective views respectively showing the internal arrangement of the optical engine 121 when viewed from different angles. FIG. 2C is a view showing an optical path in the optical engine 121.

As shown in FIGS. 2A and 2B, the optical engine 121 is an optical engine for a phenomenally downsized laser pico projector having a width of about 24 mm, a depth of about 13 mm, a height of about 5 mm, and a capacity of about 1.5 cc while achieving a resolution of 720p and high image quality. The optical engine 121 includes a laser diode (semiconductor laser) 201 of ultraviolet light, and a prism mirror 204 for reflecting a light beam from the laser diode 201.

The laser diode 201 is arranged on one side of a housing 210 to face the inside of the housing 210. The prism mirror 204 reflects the laser beam (light beam) from the laser diode 201 upward in FIG. 2C, and further reflects the light beam toward the inside of the housing 210. The optical engine 121 includes a collimator lens 205 between the laser diode 201 and the prism mirror 204, thereby adjusting the focal length of the laser beam to infinity.

An end portion of the housing 210 on the opposite side of the attachment surface of the laser diode 201 is provided with an inclined mirror 206 inclining toward the bottom surface of the housing 210. The inclined mirror 206 reflects a laser beam entering from the prism mirror 204 toward the bottom surface of the housing 210. Furthermore, a bottom mirror 207 is attached upward onto the bottom surface of the housing 210 between the prism mirror 204 and the inclined mirror 206. A two-dimensional MEMS (Micro Electro Mechanical Systems) mirror 209 and a cover glass 212 are provided to sandwich the bottom mirror 207. The bottom mirror 207 reflects, upward toward the two-dimensional MEMS mirror 209, the laser beam entering from the inclined mirror 206. A prism 208 that determines an image projection elevation angle and size is provided at a position on the cover glass 212, which is adjacent to the two-dimensional MEMS mirror 209.

On the other hand, another bottom mirror 213 is provided between the bottom mirror 207 and the cover glass 212. A photosensor 215 is included between the prism mirror 204 and the prism 208. To calibrate the position of the two-dimensional MEMS mirror 209, the photosensor 215 notifies an external MEMS controller of the timing at which the light beam enters from the two-dimensional MEMS mirror 209 via the bottom mirror 213.

Furthermore, the inclined mirror 206 is a half mirror. A laser power sensor 216 is provided behind the inclined mirror 206, that is, in a gap between the wall portion of the housing 210 and the inclined mirror 206 to detect laser power and notify an external laser scan display controller of it.

With a scanning light beam that has been reflected by the two-dimensional MEMS mirror 209 and has passed through the prism 208 and the cover glass 212, a circuit pattern is formed on the sheet 130.

The optical path in the optical engine 121 will be described next with reference to FIG. 2C. Since the optical path will be explained with reference to FIG. 2C, unnecessary wiring lines and housing are omitted or simplified.

The laser beam exiting from the prism mirror 204 is reflected by the inclined mirror 206 toward the bottom mirror 207. The bottom mirror 207 reflects upward the laser beam entering from the inclined mirror 206, and the reflected light enters the central portion of the two-dimensional MEMS mirror 209 via the prism 208. The two-dimensional MEMS mirror 209 is a driving mirror that is driven based on an externally input control signal, and vibrates to reflect the light beam by changing an angle in the horizontal direction (X direction) and the vertical direction (Y direction).

<Arrangement of Projector>

Figure 3:
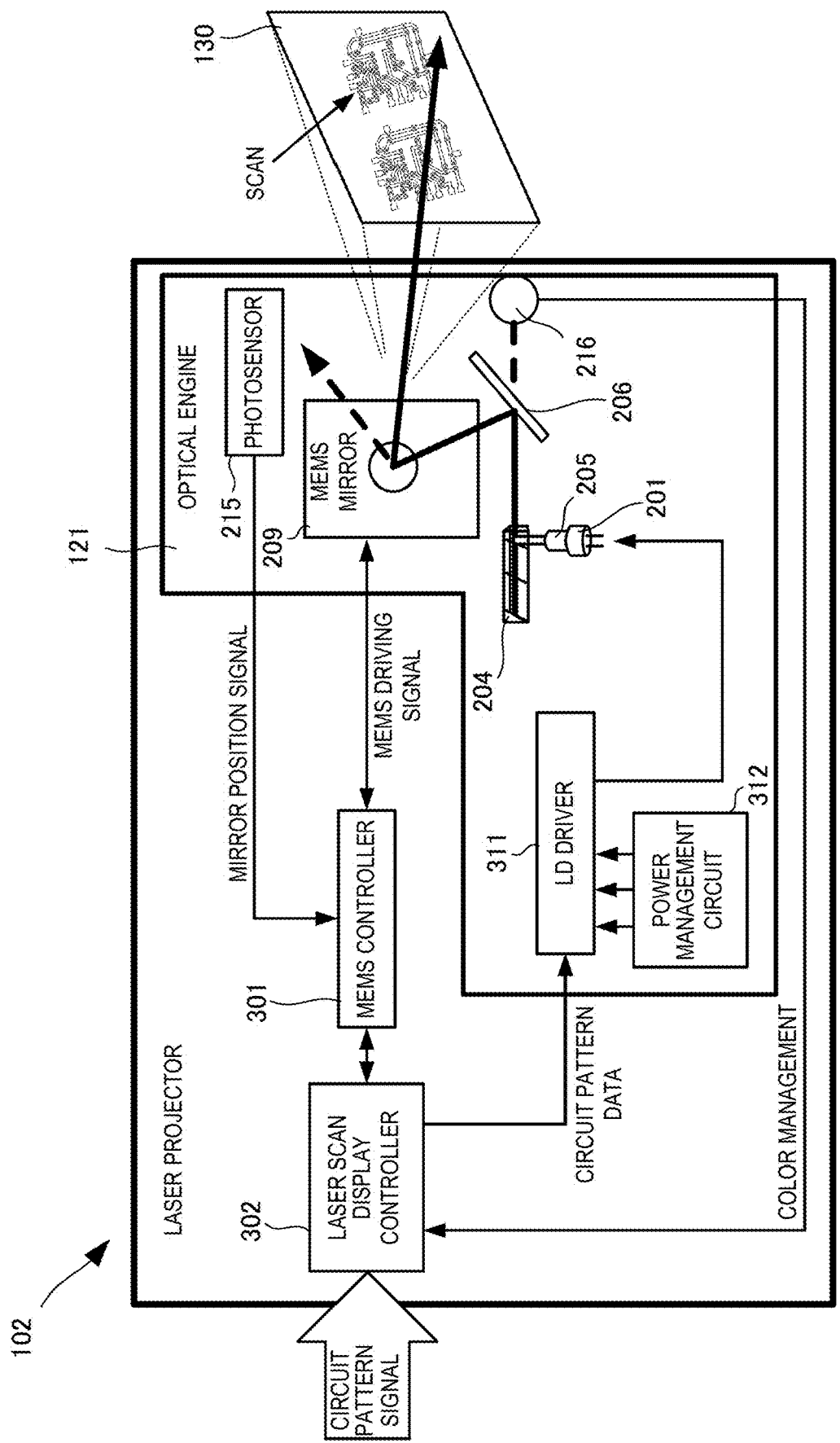
FIG. 3 is a view showing the arrangement of a projector included in the circuit pattern manufacturing apparatus according to the first example embodiment of the present invention.

FIG. 3 is a view showing the arrangement of the laser projector 102 including the optical engine 121. The optical engine 121 includes a laser diode driver (an LD driver in FIG. 3) 311 and power management circuits 312 in addition to the components described with reference to FIGS. 2A and 2B.

In addition to the optical engine 121, the laser projector 102 includes a MEMS controller 301 and a laser scan display controller 302. If a circuit pattern signal is externally input, the laser scan display controller 302 extracts a pixel count and a size, and transmits them to the MEMS controller 301.

The power management circuits (PMCs) 312 control so the laser diode driver 311 does not erroneously operate during an initial transient period, for example, a rising period or falling period. Especially, during the transient period, the output power may be lower than a necessary voltage. The laser diode driver 311 may erroneously operate due to a low voltage and/or a fluctuation in voltage. To avoid this problem, the functional circuit block can be set in a reset state during the transient period.

The laser power sensor 216 detects the power of the laser beam transmitted through the inclined mirror 206, and feeds back power data to the laser scan display controller 302, thereby controlling the illuminance of the laser diode 201.

Figure 4:
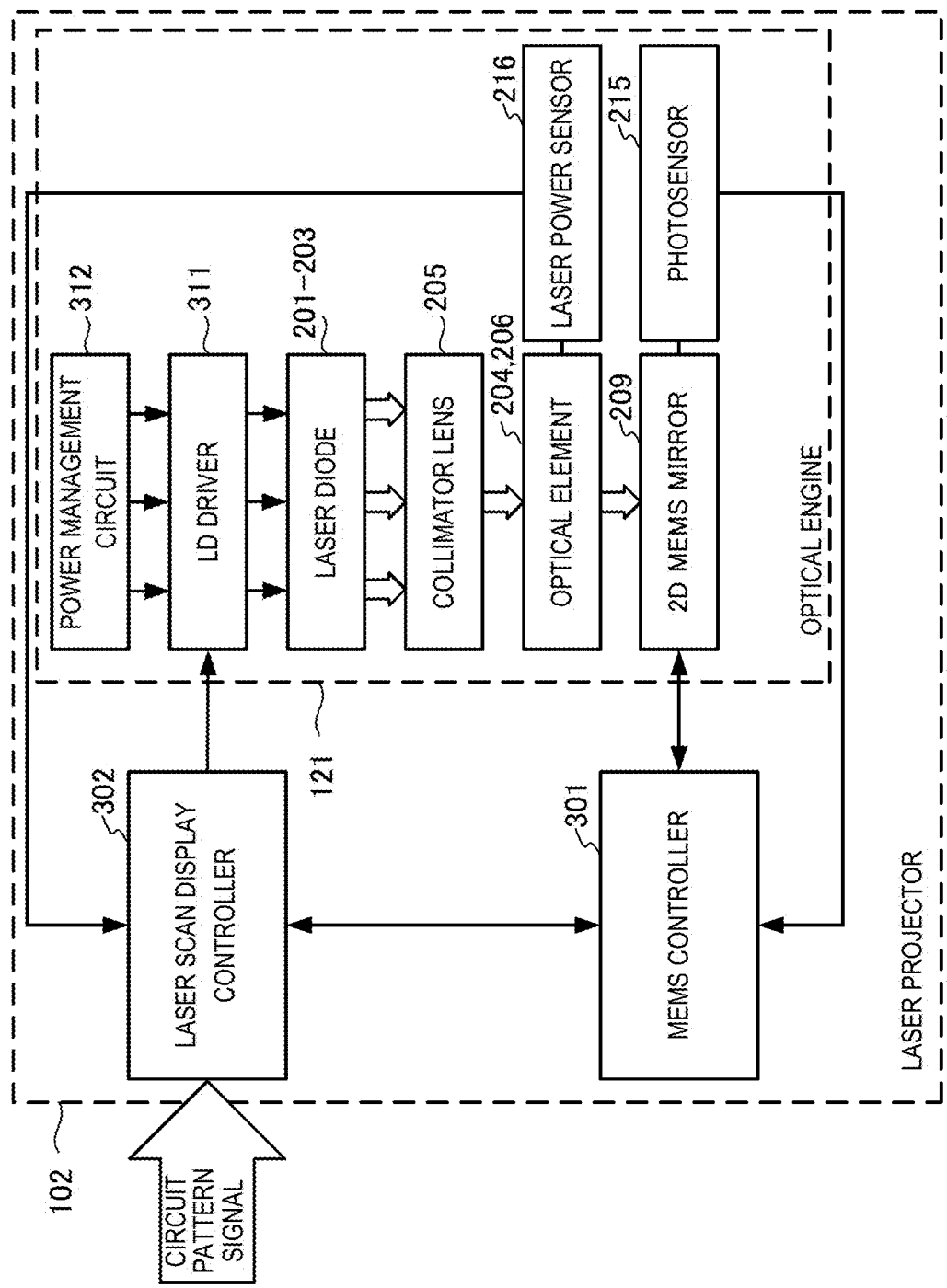
FIG. 4 is a block diagram showing the functional arrangement of the projector included in the circuit pattern manufacturing apparatus according to the first example embodiment of the present invention.

FIG. 4 is a block diagram showing the functional arrangement of the laser projector 102. The circuit pattern signal input to the laser scan display controller 302 is modulated there, and sent to the laser diode driver 311. The laser diode driver 311 controls the luminance and irradiation timing of a laser projected by driving an LD (Laser Diode). The laser scan display controller 302 drives the MEMS controller 301 at the same time to vibrate the two-dimensional MEMS mirror 209 with respect to two axes under an optimum condition. The power management circuits 312 control the laser diode driver 311 to cause the laser diode 201 to emit light at an appropriate voltage at an appropriate timing. The laser beam reflected by the two-dimensional MEMS mirror 209 via the collimator lens 205 and optical systems such as the prism mirror 204 and inclined mirror 206 is projected on the sheet 130 as a circuit forming laser beam. Note that the LD has been exemplified as a light source. A component usable as a light source is not limited to the LD and an LED (Light Emitting Diode) may be used.

The above-described MEMS scan method provides light utilization efficiency much higher than that in DLP (Digital Light Processing). Thus, the same circuit pattern formation and shaping as in DLP can be implemented with a laser of much lower power. That is, it is possible to reduce the cost and power consumption and decrease the size while achieving high accuracy. Furthermore, it is possible to narrow a laser beam ($\phi 0.8$ mm→$\phi 0.02$ mm), thereby improving the shaping accuracy. Furthermore, it is possible to change a laser beam irradiation area by changing the irradiation distance of the optical engine 121. The laser beam irradiation area may be changed by software without changing the irradiation distance of the optical engine 121.

Figure 5:
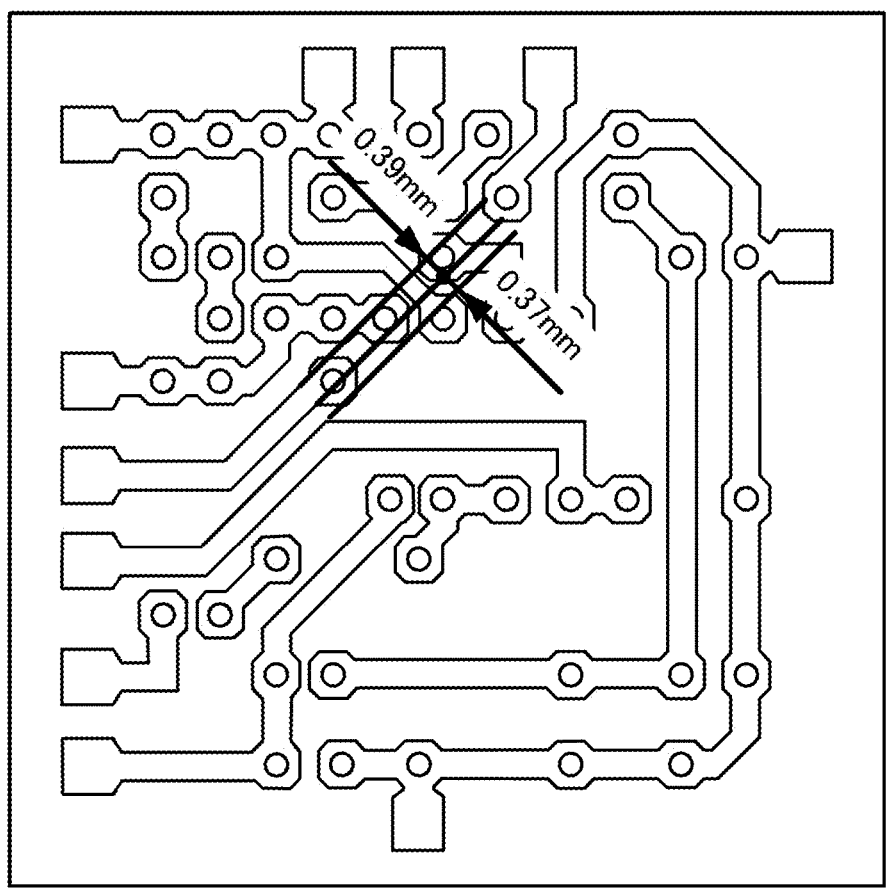
FIG. 5 is a view showing a circuit pattern manufactured by the circuit pattern manufacturing apparatus according to the first example embodiment of the present invention.

FIG. 5 is a view showing the circuit pattern manufactured by the circuit pattern manufacturing apparatus 100 according to this example embodiment. The L/S (Line/Space) of the manufactured circuit pattern is 0.39 mm/0.37 mm.

Figure 6:
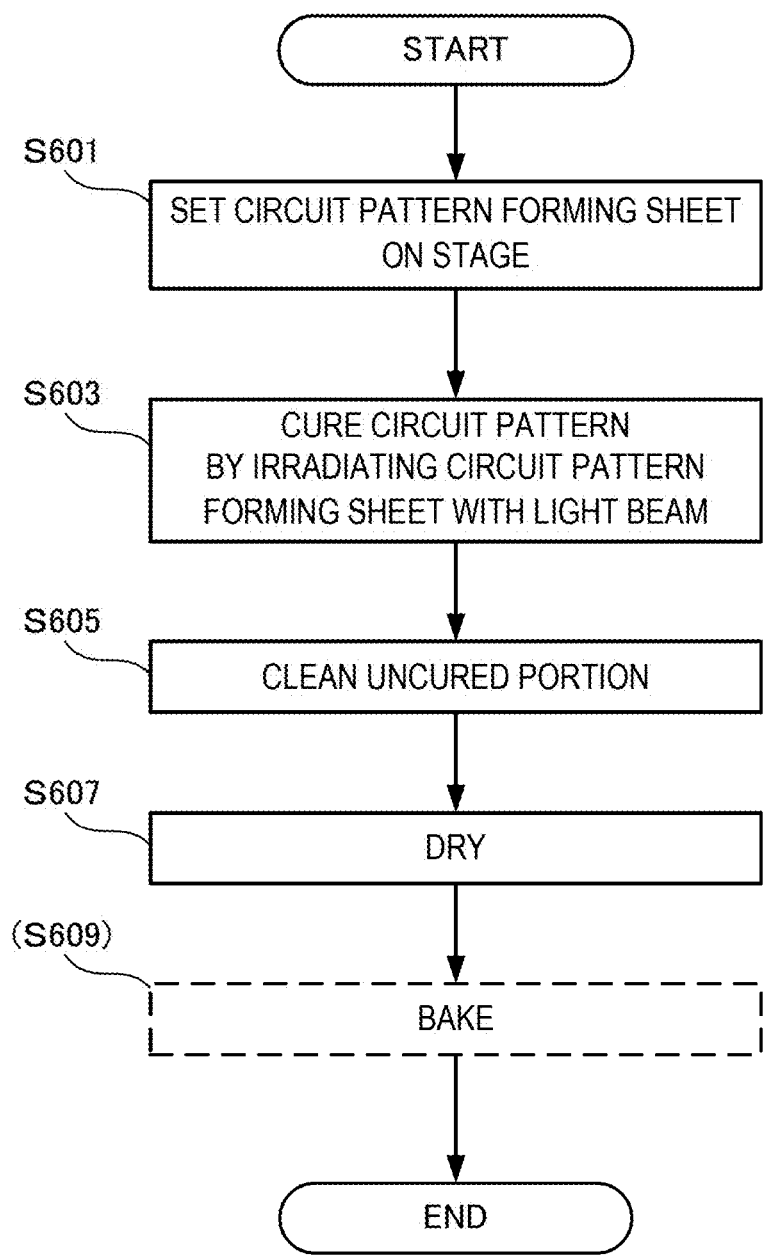
FIG. 6 is a flowchart illustrating a circuit pattern forming procedure by the circuit pattern manufacturing apparatus according to the first example embodiment of the present invention.

FIG. 6 is a flowchart for explaining a circuit pattern manufacturing procedure by the circuit pattern manufacturing apparatus 100 according to this example embodiment. In step S601, the circuit pattern manufacturing apparatus 100 sets the circuit pattern forming sheet 130 at a predetermined position on the stage 140. In step S603, the circuit pattern manufacturing apparatus 100 cures the circuit pattern by irradiating the circuit pattern forming sheet 130 with, for example, a laser beam (light beam) having a wavelength of 405 nm. Note that irradiation with the light beam may be performed by a scan or by a method of printing the entire circuit pattern by one irradiation operation.

In step S605, the circuit pattern manufacturing apparatus 100 washes away an uncured portion by cleaning, using IPA (IsoPropyl Alcohol) or the like, the sheet 130 irradiated with the laser beam. Note that the uncured portion may be cleaned by executing ultrasonic cleaning together with cleaning by IPA. This can clean the uncured portion more reliably. In step S607, the circuit pattern manufacturing apparatus 100 dries the cleaned sheet 130. Note that step S609 is an additional step. If the circuit pattern manufacturing apparatus 100 bakes, in step S609, the sheet 130 on which the circuit pattern is formed, the resistance value of the circuit can be further decreased to perform stabilization.

Note that an example in which the circuit pattern forming sheet 130 made of the mixture containing the conductive material and the photo-curing resin is used in step S601 has been explained. However, a paste-like mixture containing a conductive material and a photo-curing resin or the like may be uniformly applied to a board such as a film.

According to this example embodiment, since a circuit pattern is exposed on a board without using a photomask on which the circuit pattern is formed, it is possible to quickly create or change the circuit pattern. Furthermore, since a circuit pattern can be formed without using a mask for a photoresist method or screen printing, it is possible to suppress the development cost. In addition, since no mask manufacturing time is required, it is possible to shorten the development period of a circuit pattern.

Furthermore, since an optical engine with a high resolution (720p) is used, for example, a high-precision circuit pattern equivalent to a membrane circuit board (L/S=0.39/0.37 mm) can be formed. Since a MEMS scanner that uses a laser diode as a light source is used, it is possible to reduce the energy consumption, lighten the load on the environment, and improve the productivity, thereby providing a user-friendly apparatus in PCB design.

Moreover, since a focus-free scanner that uses a laser diode is used, it is possible to form a circuit pattern on anything that can be thinly, uniformly applied with a paste-like mixture.

Second Example Embodiment

Figure 7A:
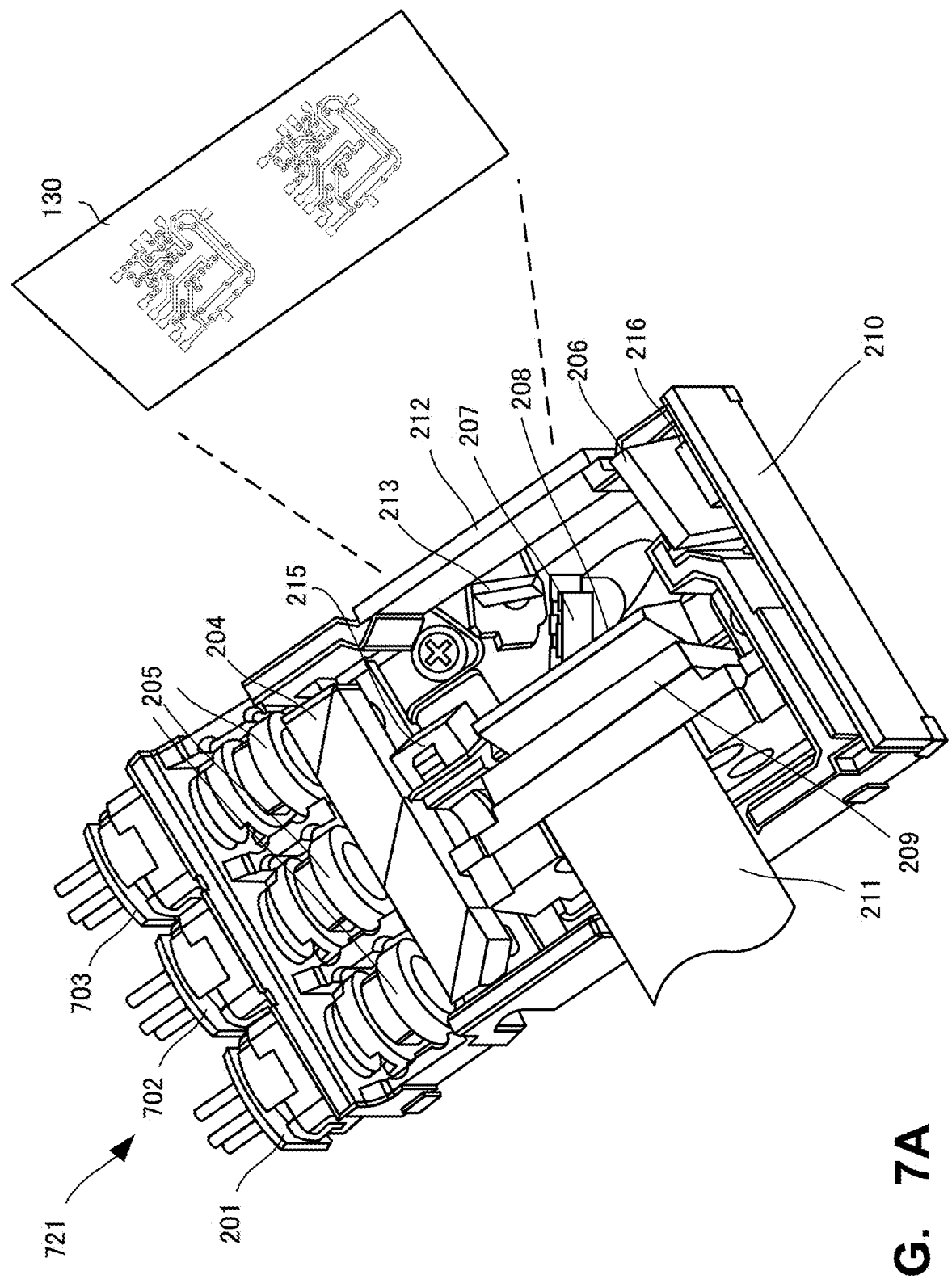
FIG. 7A is a view showing the arrangement of an optical engine included in a circuit pattern manufacturing apparatus according to the second example embodiment of the present invention.
Figure 7B:
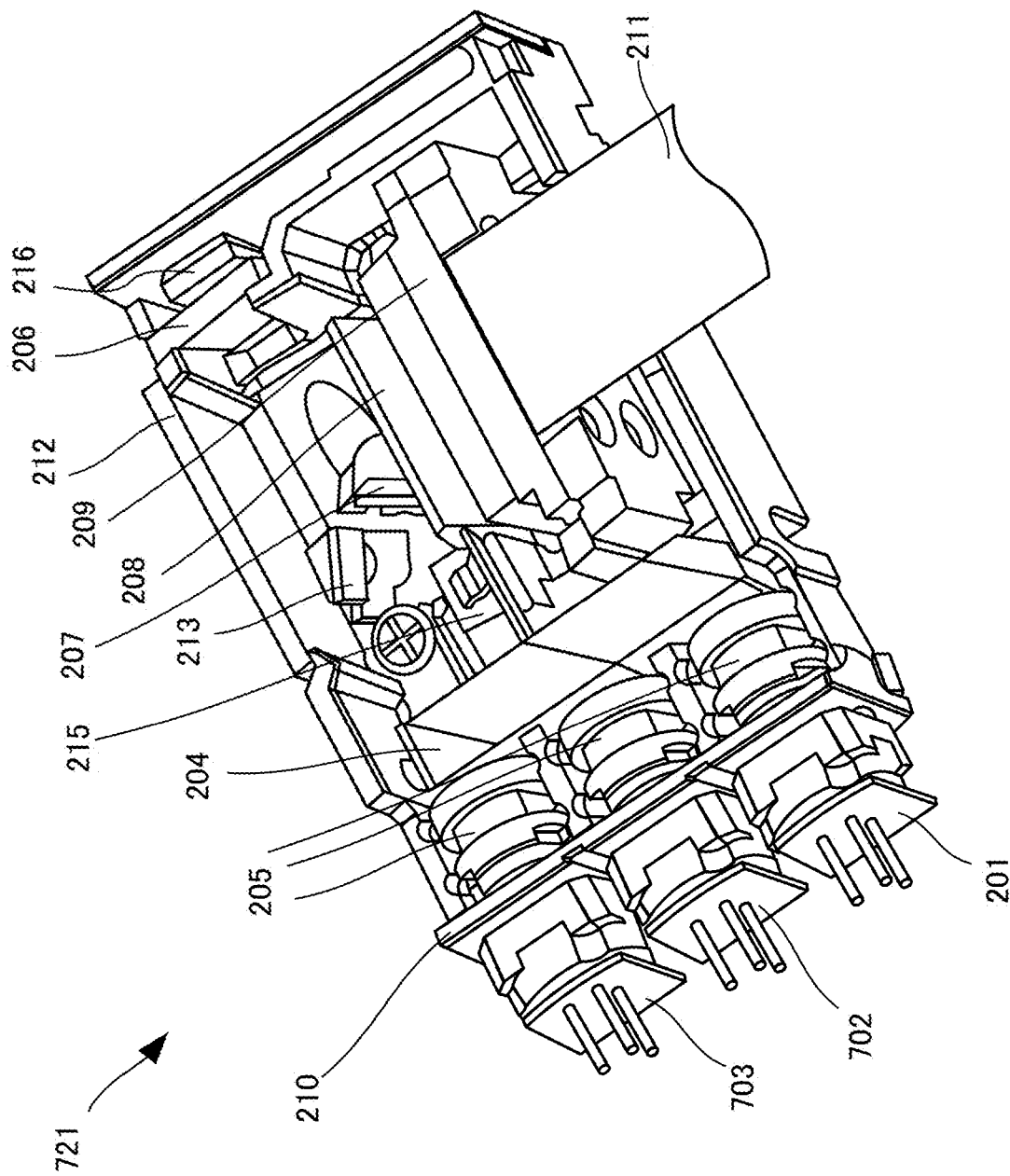
FIG. 7B is a view showing the arrangement of the optical engine included in the circuit pattern manufacturing apparatus according to the second example embodiment of the present invention.

A circuit pattern manufacturing apparatus according to the second example embodiment of the present invention will be described with reference to FIGS. 7A to 8. FIGS. 7A and 7B are views for explaining an optical engine included in the circuit pattern manufacturing apparatus according to this example embodiment. The circuit pattern manufacturing apparatus according to this example embodiment is different from that in the first example embodiment in that the optical engine includes three laser diodes. The remaining components and operations are the same as those in the first example embodiment. Hence, the same reference numerals denote the same components and operations, and a detailed description thereof will be omitted.

FIGS. 7A and 7B are perspective views respectively showing the internal arrangement of an optical engine 721 when viewed from different angles. The optical engine 721 additionally includes laser diodes 702 and 703. That is, the optical engine 721 includes three laser diodes, that is, a laser diode 201 and the laser diodes 702 and 703. A prism mirror 204 is a mirror for focusing light beams from the laser diodes 201, 702, and 703 to obtain one light beam. The prism mirror 204 reflects the two laser beams from the laser diodes 201 and 702 toward the laser diode 703. Then, the prism mirror 204 reflects again the two reflected light beams toward the inside of a housing 210 to be superimposed on the optical axis of the laser diode 703.

Note that the three laser diodes 201, 702, and 703 may be identical to each other or different from each other. For example, all the three laser diodes may be ultraviolet laser diodes, or two of the three laser diodes may be ultraviolet laser diodes and the remaining one laser diode may be a laser diode other than an ultraviolet laser diode. A combination of laser diodes can be arbitrarily determined.

Figure 7C:
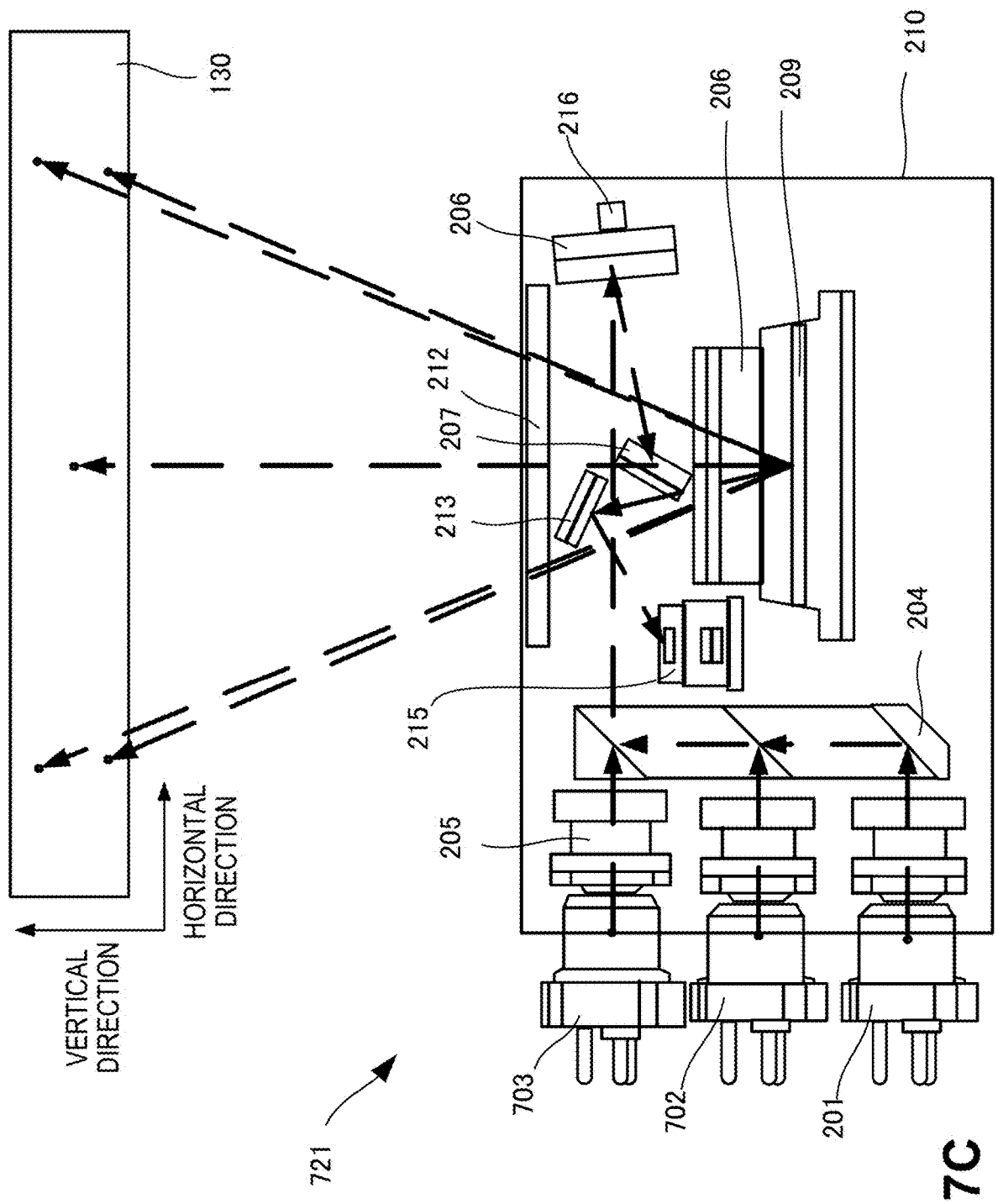
FIG. 7C is a view showing an optical path in the optical engine included in the circuit pattern manufacturing apparatus according to the second example embodiment of the present invention.

The optical path in the optical engine 721 will be described next with reference to FIG. 7C. Since the optical path will be explained with reference to FIG. 7C, unnecessary wiring lines and housing are omitted or simplified. As shown in FIG. 7C, the three light beams from the laser diodes 201, 702, and 703 enter the prism mirror 204 via collimator lenses 205, and are focused to obtain one light beam.

Figure 8:
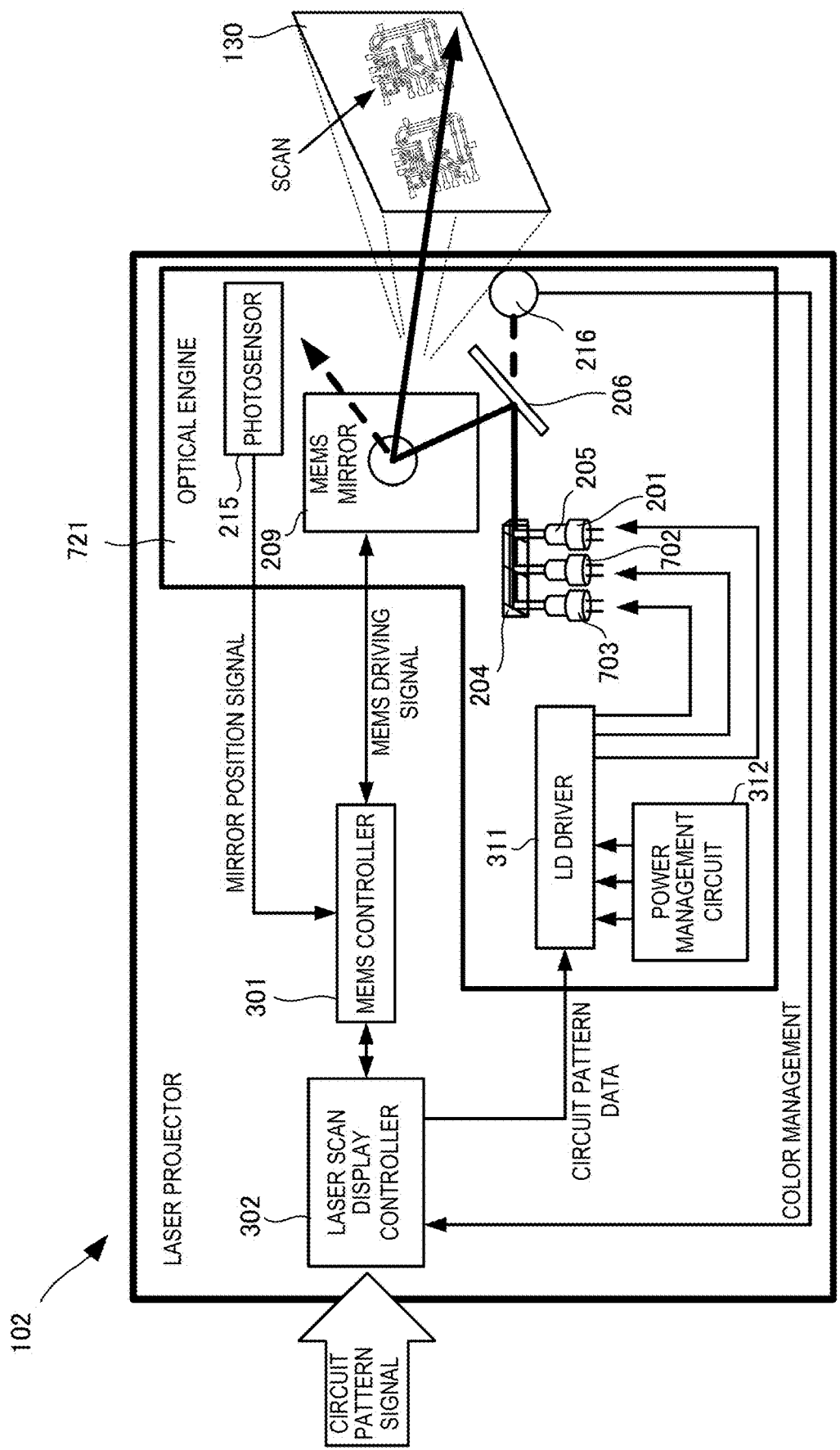
FIG. 8 is a view showing the arrangement of a projector included in the circuit pattern manufacturing apparatus according to the second example embodiment of the present invention.

FIG. 8 is a view showing the arrangement of a laser projector 102 including the optical engine 721. Power management circuits 312 control a laser diode driver 311 to cause the laser diodes 201, 702, and 703 to emit light beams at appropriate voltages at appropriate timings.

As described above, the total power of the laser diodes can be increased by changing the number of assembled laser diodes of the optical engine 721. For example, an output of 60 mW can be implemented using three laser diodes with an output of 20 mW. By assembling a plurality of laser diodes as light sources with the same wavelength, a high-output optical engine can be implemented.

By assembling a plurality of laser diodes that emit laser beams of the same wavelength and different beam diameters, it becomes possible to select sharp/soft shaping in an arbitrary place. By providing a plurality of laser diodes that emit laser beams of different wavelengths, it becomes possible to select a wavelength optimum for a photo-curing resin.

It is possible to adopt two kinds of laser beams of wavelengths corresponding to infrared light and ultraviolet light, and then automatically form a circuit pattern at a predetermined position with ultraviolet light while detecting a position with the infrared light. In this case, the infrared light serves as guide light.

The irradiation power of the laser beam can be changed for each irradiation dot. This can increase the irradiation power of an edge portion having a sectional shape, or decrease the irradiation power to prevent penetration curing in inclined shaping or the like. Power control according to a shape is possible. A shaping surface step can be changed by changing a spot diameter.

According to this example embodiment, since the number of laser diodes is increased, the output of the laser beam is improved. This can increase the scanning speed of the laser beam, and further improve the forming speed of a circuit pattern.

Third Example Embodiment

Figure 9A:
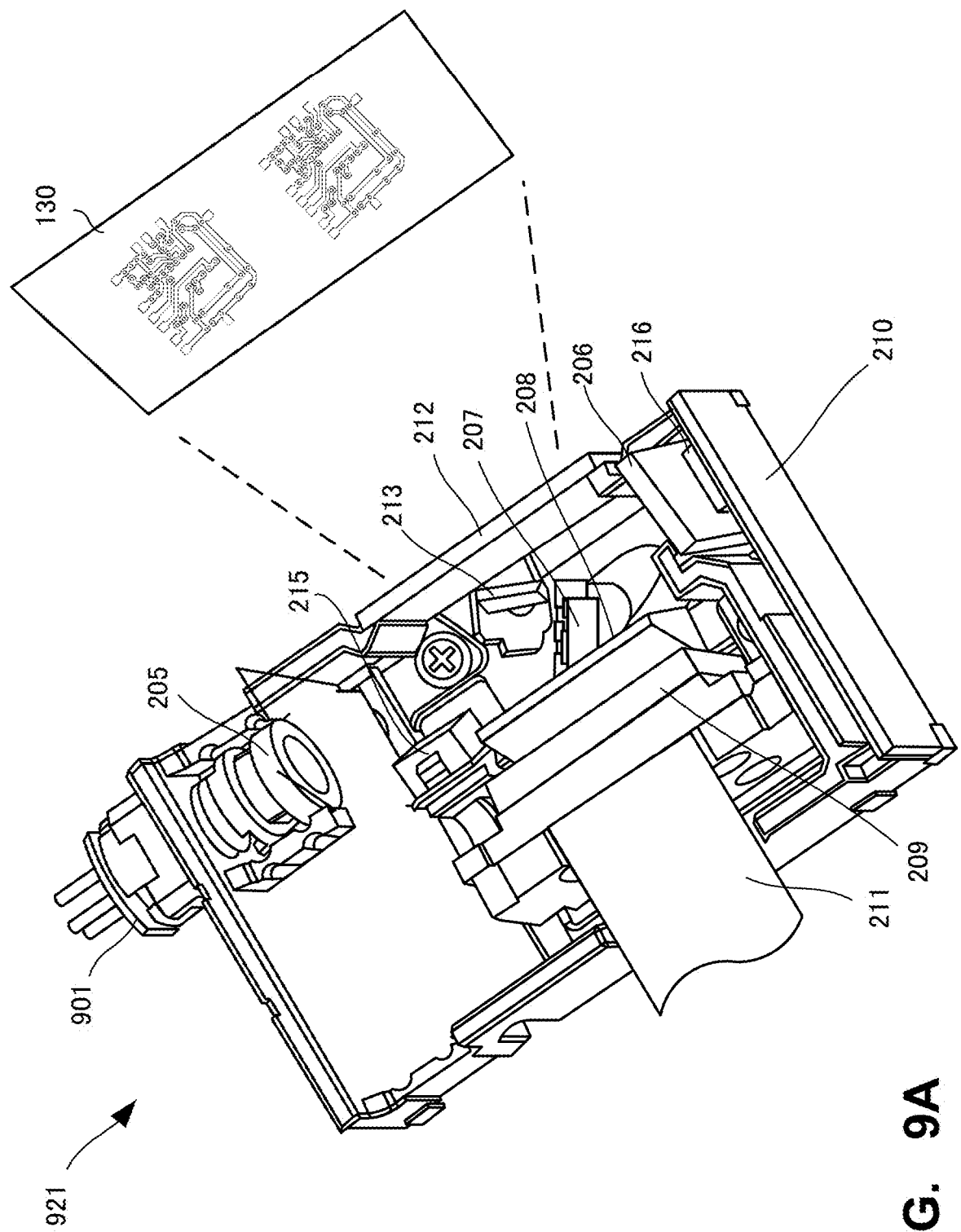
FIG. 9A is a view showing the arrangement of an optical engine included in a circuit pattern manufacturing apparatus according to the third example embodiment of the present invention.

A circuit pattern manufacturing apparatus according to the third example embodiment of the present invention will be described with reference to FIGS. 9A to 9C. FIGS. 9A and 9C are views for explaining an optical engine included in the circuit pattern manufacturing apparatus according to this example embodiment. The circuit pattern manufacturing apparatus according to this example embodiment is different from that according to the first example embodiment in that the arrangement position of the optical engine is different and no prism mirror is included. The remaining components and operations are the same as those in the first example embodiment. Hence, the same reference numerals denote the same components and operations, and a detailed description thereof will be omitted.

Figure 9B:
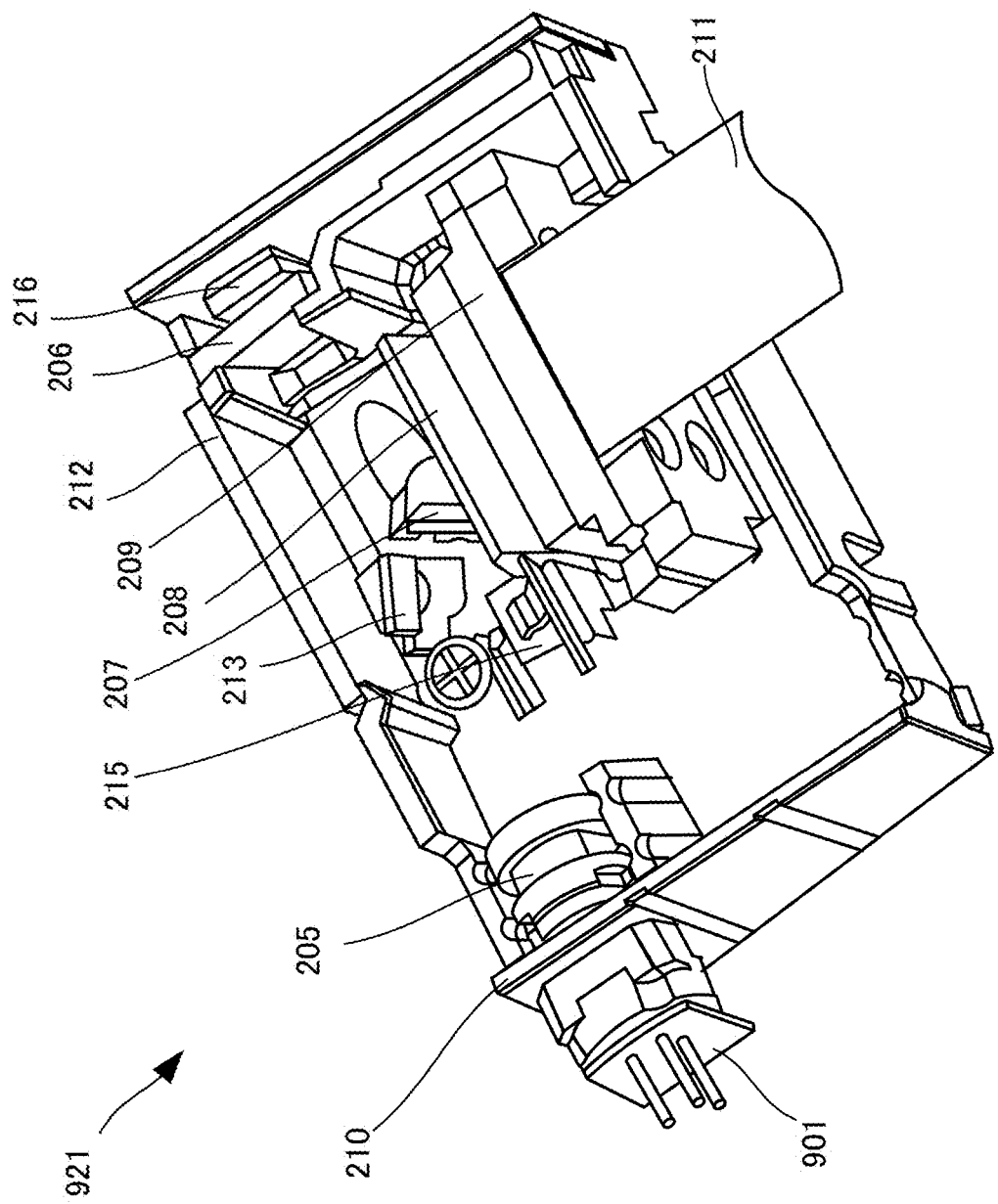
FIG. 9B is a view showing the arrangement of the optical engine included in the circuit pattern manufacturing apparatus according to the third example embodiment of the present invention.
Figure 9C:
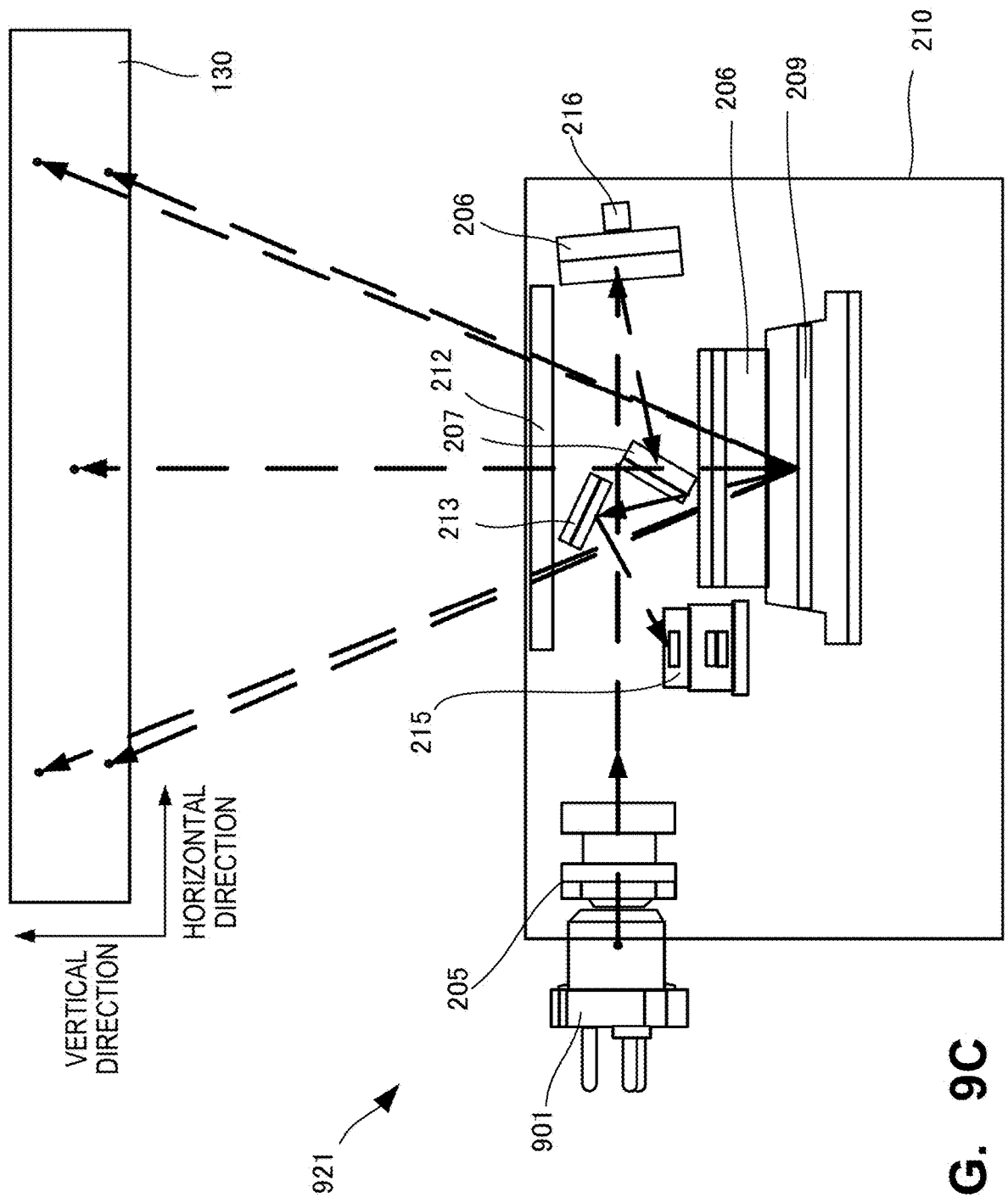
FIG. 9C is a view showing an optical path in the optical engine included in the circuit pattern manufacturing apparatus according to the third example embodiment of the present invention.

As shown in FIGS. 9A to 9C, an optical engine 921 includes a laser diode 901, and the laser diode 901 is provided on the side of a cover glass 212. In this example embodiment, since the laser diode 901 is provided on the side of the cover glass 212, a prism mirror for guiding a light beam from the laser diode 901 to an inclined mirror 206 or the like is not provided.

By providing the laser diode 901 on the side of the cover glass 212, a prism mirror becomes unnecessary. Thus, a housing 210 of an optical engine 121 can be further downsized. Consequently, a laser projector 102 incorporating the optical engine 121 can also be downsized.

According to this example embodiment, since the laser diode is provided on the cover glass side, the optical engine and laser projector can be downsized, and thus the circuit pattern manufacturing apparatus can be further downsized.

Other Example Embodiments

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

The present invention is applicable to a system including a plurality of devices or a single apparatus. The present invention is also applicable even when an information processing program for implementing the functions of example embodiments is supplied to the system or apparatus directly or from a remote site. Hence, the present invention also incorporates the program installed in a computer to implement the functions of the present invention by the computer, a medium storing the program, and a WWW (World Wide Web) server that causes a user to download the program. Especially, the present invention incorporates at least a non-transitory computer readable medium storing a program that causes a computer to execute processing steps included in the above-described example embodiments.

The invention claimed is:

1. A circuit pattern manufacturing apparatus comprising:
   a forming unit that forms a circuit pattern by irradiating a circuit pattern forming sheet with a light beam,
   wherein said forming unit comprises, as an optical engine:
      a housing;
      a laser diode that is arranged on one side in said housing and emits a laser beam;
      a prism mirror that reflects the laser beam from said laser diode;
      an inclined mirror that reflects the laser beam entering from said prism mirror toward a bottom surface of said housing;
      a bottom mirror that is provided on the bottom surface of said housing and reflects the reflected light from said inclined mirror upward; and
      a two-dimensional micro electro mechanical systems mirror, serving as a driving mirror, reflects the reflected light from said bottom mirror and conducts scanning of the circuit pattern on the circuit pattern forming sheet by changing an angle in a vertical direction and a horizontal direction.

2. The circuit pattern manufacturing apparatus according to claim 1, wherein as the laser diode,
   at least one first laser diode and at least one second laser diode are arranged on the one side in said housing and emit the laser beams,
   the prism mirror reflects the laser beam from said first laser diode, and further reflects the laser beam in accordance with an optical axis of said second laser diode.

3. A combination of the circuit pattern manufacturing apparatus according to claim 1 and the pattern forming sheet for forming a circuit pattern,
   wherein the circuit pattern forming sheet comprises:
      an insulating sheet base material layer, and
      a mixture layer,
      wherein the circuit pattern forming sheet has adhesion,
      the insulating sheet base material layer is a flexible base, and
      the mixture layer comprises a conductive material and a photo-curing resin, is a mixture in a paste form, and is uniformly applied to at least one side of the at least one insulating sheet base material layer.

4. The combination of the circuit pattern manufacturing apparatus and the pattern forming sheet for forming a circuit pattern according to claim 3, wherein the conductive material contains at least one material selected from the group consisting of silver, gold, copper, platinum, lead, zinc, tin, iron, and aluminum.

5. The combination of the circuit pattern manufacturing apparatus and the pattern forming sheet for forming a circuit pattern according to claim 3,
   wherein the circuit pattern forming sheet comprises a plurality of the mixture layers, and
   in the circuit pattern forming sheet, the insulating sheet base material layer is disposed between two of the plurality of the mixture layers from above and from below the insulating sheet base material layer.

6. The combination of the circuit pattern manufacturing apparatus and the pattern forming sheet for forming a circuit pattern according to claim 3,
   wherein the circuit pattern forming sheet comprises a plurality of the insulating sheet base material layers and a plurality of the mixture layers, and
   the circuit pattern forming sheet is formed by alternately stacking at least one of the plurality of the insulating sheet base material layers and at least one of the plurality of the mixture layers.

7. The combination of the circuit pattern manufacturing apparatus and the pattern forming sheet for forming a circuit pattern according to claim 3,
   wherein the conductive material contains 83 wt % of silver particles and an average diameter of the silver particles is 10 μm.

8. A circuit pattern manufacturing method comprising:
forming a circuit pattern by irradiating a circuit pattern forming sheet with a light beam using a two-dimensional micro electro mechanical systems mirror,
wherein the circuit pattern forming sheet comprises:
an insulating sheet base material layer, and
a mixture layer,
wherein the circuit pattern forming sheet has adhesion,
the insulating sheet base material layer is a flexible base, and
the mixture layer comprises a conductive material and a photo-curing resin, is in a paste form, and is uniformly applied to at least one side of the insulating sheet base material layer, and
wherein the forming comprises:
reflecting, by a prism mirror, a laser beam emitted from a laser diode within a housing,
reflecting, by an inclined mirror, the laser light beam entering from the prism mirror toward a bottom surface of the housing,
reflecting, by a bottom mirror on the bottom surface of the housing, the reflected light from the inclined mirror, and
reflecting the reflected light from the bottom mirror and scanning the circuit pattern on the circuit pattern forming sheet with the reflected light from the bottom mirror, by the two-dimensional micro electro mechanical systems mirror serving as a driving mirror, by changing an angle of the two-dimensional micro electro mechanical systems mirror in a vertical direction and a horizontal direction.

9. The circuit pattern manufacturing method according to claim 8,
wherein the laser diode comprises a first laser diode and a second laser diode, and
the reflecting by the prism mirror is performed by reflecting, by the prism mirror, a laser beam emitted from the first laser diode within the housing, and by reflecting, by the prism mirror, a laser beam in accordance with an optical axis of the second laser diode within the housing.

10. A non-transitory computer readable medium storing a circuit pattern manufacturing program having computer-readable instructions which, when executed by a computer, cause the computer to execute a method comprising:
forming a circuit pattern by irradiating a circuit pattern forming sheet with a light beam, wherein the circuit pattern forming sheet comprises:
an insulating sheet base material layer; and
a mixture layer,
wherein the circuit pattern forming sheet has adhesion,
the insulating sheet base material layer is a flexible base,
the mixture layer comprises a conductive material and a photo-curing resin, is in a paste form, and is uniformly applied to at least one side of the insulating sheet base material layer, and
wherein the forming comprises:
reflecting, by a prism mirror, a laser beam emitted from a laser diode within a housing,
reflecting, by an inclined mirror, the laser light beam entering from the prism mirror toward a bottom surface of the housing,
reflecting, by a bottom mirror on the bottom surface of the housing, the reflected light from the inclined mirror, and
reflecting the reflected light from the bottom mirror and scanning the circuit pattern on the circuit pattern forming sheet with the reflected light from the bottom mirror, by a two-dimensional micro electro mechanical systems mirror serving as a driving mirror, by changing an angle of the two-dimensional micro electro mechanical systems mirror in a vertical direction and a horizontal direction.

11. The non-transitory computer readable medium according to claim 10,
wherein the laser diode comprises a first laser diode and a second laser diode, and
the reflecting by the prism mirror is performed by reflecting, by the prism mirror, a laser beam emitted from the first laser diode within the housing, and by reflecting, by the prism mirror, a laser beam in accordance with an optical axis of the second laser diode within the housing.

* * * * *